United States Patent
Kleider et al.

(10) Patent No.: US 8,004,818 B2
(45) Date of Patent: Aug. 23, 2011

(54) ADJUSTABLE DEVICE AND METHOD FOR VARYING THE APPARANT VALUE OF CAPACITANCE

(75) Inventors: Jean-Paul Kleider, Bures-sur-Yvette (FR); Christian Godet, Rennes (FR); Alexander Gudovskikh, Saint Petersburg (RU)

(73) Assignee: Centre National de la Recherche Scientifique - CNRS, Paris (FR)

( * ) Notice: Subject to any disclaimer, the term of this patent is extended or adjusted under 35 U.S.C. 154(b) by 236 days.

(21) Appl. No.: 12/306,844

(22) PCT Filed: Jun. 26, 2007

(86) PCT No.: PCT/FR2007/001068
§ 371 (c)(1),
(2), (4) Date: Apr. 15, 2009

(87) PCT Pub. No.: WO2008/000949
PCT Pub. Date: Jan. 3, 2008

(65) Prior Publication Data
US 2009/0273394 A1 Nov. 5, 2009

(30) Foreign Application Priority Data
Jun. 30, 2006 (FR) .................................... 06 05952

(51) Int. Cl.
*H01G 7/00* (2006.01)
*H01G 7/06* (2006.01)
*H01L 29/92* (2006.01)

(52) U.S. Cl. .. 361/277; 361/281; 257/595; 257/E29.342

(58) Field of Classification Search ................... 257/595, 257/E29.342; 361/277, 281
See application file for complete search history.

(56) References Cited

U.S. PATENT DOCUMENTS
5,558,477 A * 9/1996 Browning et al. ............ 408/143
2004/0207486 A1 10/2004 York

FOREIGN PATENT DOCUMENTS
WO WO 02/23633 A2 3/2002

OTHER PUBLICATIONS

Marc Beale et al., "The Origins and Characteristics of Negative Capacitance in Metal-Insulator-Metal Devices", Phylosophical Magazine B, vol. 65, No. 1, Jan. 1992, pp. 47-64.
N.A. Penin, "Negative Capacitance in Semiconductor Structures", Semiconductors AIP USA, vol. 30, No. 4, Apr. 1996, pp. 340-343.
Maxim Ershov et al., "Negative Capacitance Effect in Semiconductor Devices", IEEE Transactions on Electron Devices, IEEE Service Center, Piscataway, NJ, US, vol. 45, No. 10, Oct. 1998.

* cited by examiner

*Primary Examiner* — Evan Pert
(74) *Attorney, Agent, or Firm* — Arent Fox LLP

(57) ABSTRACT

The invention specifically concerns a device for varying the apparent level of a capacitance, said device being characterized in that it compromises: —a dipole (1) of a type known per se, comprising a semiconductor material (4) for electronic transfer via hopping situated between a first electrode (2) and a second electrode (6), with said dipole (1) situated parallel to said capacitance (12); —a continuous voltage generator (13) electrically connected to the second electrode (6) and the first electrode (2) of the dipole (1); —and a means for varying the voltage generated by the generator (13).

11 Claims, 7 Drawing Sheets

ADJUSTABLE DEVICE AND METHOD FOR VARYING THE APPARENT VALUE OF CAPACITANCE

CROSS-REFERENCE TO RELATED APPLICATION

Figure 1:
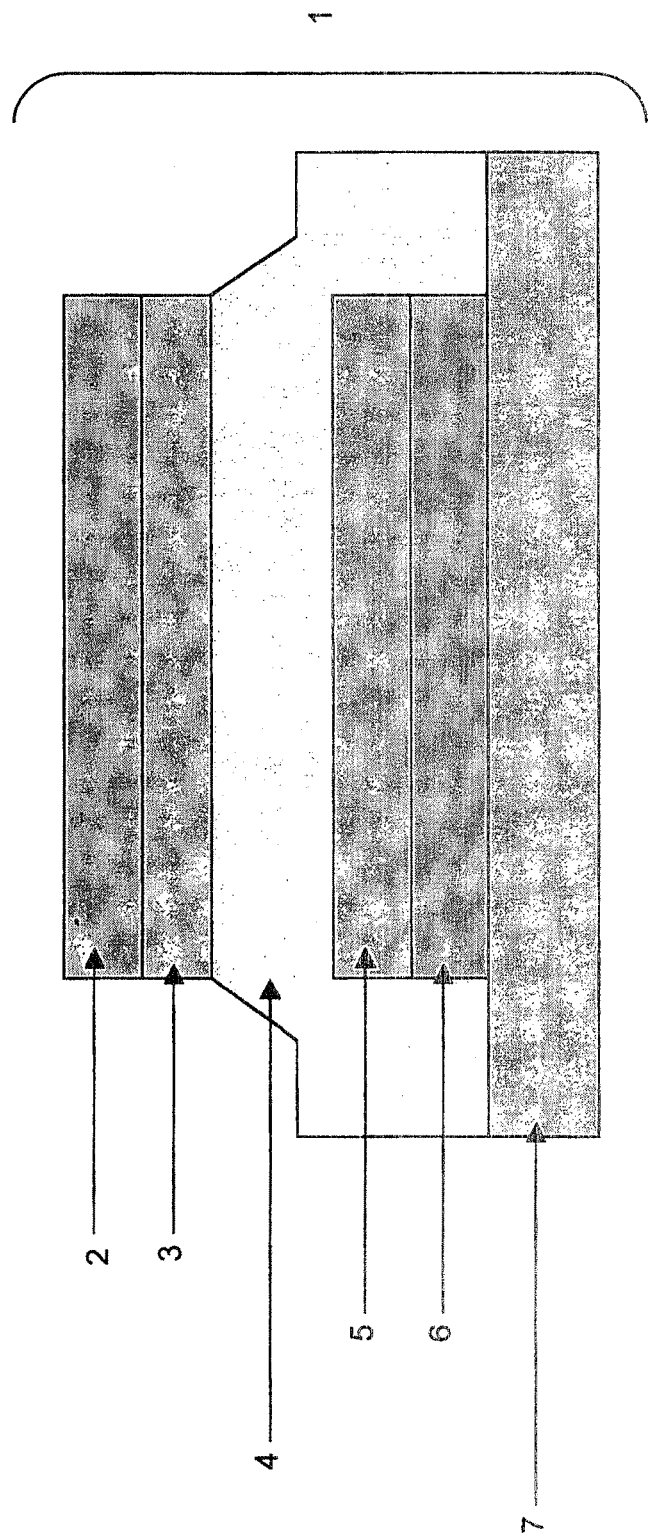

This application is a National Stage entry on International Application PCT/FR2007/01068, filed Jun. 26, 2007, the disclosure of the prior application being incorporated in its entirety by reference.

The present invention relates to a device for varying the apparent value of a capacitance.

The present invention also relates to a method for varying the apparent value of a capacitance.

Within the context of certain applications in the field of electronics, the capacitive or inductive nature of the impedance or admittance of a circuit must be controlled, or the undesirable effects of a capacitance in a circuit must be offset.

A known solution of the prior art is to produce a capacitance with a negative value, as is described in patent application U.S. Pat. No. 5,558,477, which relates to a device comprising a negative reactance circuit comprising an amplifier, a charged capacitor, a resistor and a potential divider and which is connected to a piezoelectric device. Said circuit serves to simulate a negative capacitance in order to offset the capacitance of said equipment, this having the effect of controlling the mechanical actions of said device based on the electromechanical properties thereof.

An electronic device comprising two nodes and having means for offsetting the capacitive impedance between said nodes is also known from international patent application PCT WO 96/28847. Said means comprise discrete elements associated with a polarised junction diode in avalanche mode which reproduces the behaviour of a negative capacitance in order to offset, and in some cases to cancel out a positive parasitic capacitance connected in parallel.

The disadvantage of such devices is that they do not enable the capacitance to be varied. In addition, they require a large surface to be incorporated on an integrated circuit. Furthermore, said devices are complex and costly to manufacture.

It is also known to obtain negative capacitances on the basis of materials, organic or including nano-particles or nano-tubes, entering into the composition of semiconductors.

Such is the case, for example, with organic polymers as is shown in the publication:

"Modeling negative capacitance effect in organic polymers" in the review "Solid-state-electronics", 2003, pages 1089-1093, by KWOK-H-L, or even the case of carbon nanotubes in the publication:

"Negative quantum capacitance of gated carbon nanotubes" in the review "Physical-Review-B-Condensed-Matter-and-Materials-Physics", 15 Jul. 2005, pages 35455-1-5, by "Latessa, -L.; Pecchia, -A.; Di-Carlo, -A.; Lugli, -P".

The disadvantage of said materials and, in particular, organic materials, is that same suffer from problems of ageing and unreliability. Other materials can have problems of incompatibility with silicon technologies, and they are complex and costly to manufacture. Furthermore, they do not enable the capacitance to be varied.

The following publication of the prior art is also known:

"High-field transport in amorphous carbon and carbon nitride films" in the review "Journal of Non-Crystalline Solids", 15 Jun. 2004, Vol. 338-340, pp. 349-352 by Kleider-J P, Gudovskikh-A., Godet-C.

This document presents a device comprising a dipole, said dipole comprising electronic hopping transport semiconductor material placed between a first electrode and a second electrode. Furthermore, it describes material having electronic transport and in particular hopping transport, properties in localised states, such as hydrogenated amorphous carbon nitride which, when placed in a hydrogenated metal/amorphous carbon nitride/metal device, takes different admittance values for direct or alternating voltages applied to said device, depending on a temperature or a frequency.

The present invention aims to solve the disadvantages of the prior art.

More particularly, one of the aims of the invention is to vary the apparent value of a capacitance.

Another aim of the invention is to provide a device which is compact and can be integrated in an integrated circuit.

For this purpose, the present invention relates to a device for varying the apparent value of a capacitance, said device being characterised in that it comprises:
- a dipole of a known type, comprising an electronic hopping transport semiconductor material placed between a first electrode and a second electrode, said dipole being arranged in parallel with said capacitance;
- a direct voltage generator connected electrically to the second electrode and to the first electrode of said dipole;
- means for varying the voltage generated by the generator.

In such a device where the dipole, the direct voltage generator and the capacitance are in parallel, the variation of the voltage at the terminals of the dipole causes the capacitance of the entire device to vary.

In an alternative embodiment, the device comprises an alternating voltage generator arranged in series with said direct voltage generator.

In an alternative embodiment, the first electrode comprises a metallic line of the first electrode and a contact surface of the first electrode, and the second electrode comprises a metallic line of the second electrode and a contact surface of the second electrode, said semiconductor material being placed between said metallic line of the first electrode and said metallic line of the second electrode, said generator being connected electrically to the first electrode and to the second electrode respectively at the level of the contact surface of the first electrode and at the level of the contact surface of the second electrode.

Said structure of the dipole has the advantage of being relatively easy to insert into integrated circuits by the contact surfaces of the first electrode and the second electrode.

In an alternative embodiment, the dipole is made up of a glass substrate:
- a layer of a hydrogenated amorphous carbon nitride alloy constituting the semiconductor,
- and a layer of aluminium for each of the co-planar electrodes.

In another alternative embodiment, the dipole is made up of a glass substrate and a succession of the following layers:
- a layer of aluminium constituting the first electrode,
- a layer of titanium-tungsten alloy,
- a layer of a hydrogenated amorphous carbon nitride alloy constituting the semiconductor,
- a layer of a titanium-tungsten alloy,
- and a layer of aluminium constituting the second electrode.

It can be noted that when the electrodes of the dipole are made from the same metal or the same combination of metals, the electrical properties thereof do not depend on the sign of the voltage applied.

The invention also relates to a method for varying the apparent value of the capacitance, said method comprising steps consisting of:

placing the following in parallel:
  said capacitance,
    a dipole of a known type, comprising an electronic hopping transport semiconductor material placed between a first electrode and a second electrode,
    and a direct voltage generator connected electrically to the first electrode and to the second electrode,
  applying a direct voltage to the terminals of said first electrode and of said second electrode,
  varying said voltage generated by the generator.

Said method makes it possible to vary the apparent value of a capacitance, which can be a capacitor or an electric circuit having an equivalent capacitance, by varying the direct voltage to the terminals of the dipole.

In one embodiment, said method comprises a step consisting of varying said voltage up to a value, said value being chosen so that the apparent value of said capacitance is negative.

Said step of the method has the advantage of being able to obtain a negative apparent value of the capacitance for a given voltage by varying the voltage.

In an alternative embodiment, said method comprises a step consisting of varying said voltage up to a value, said value being chosen so that the apparent value of said capacitance is zero.

In an alternative embodiment, said method comprises a step consisting of selecting an alternating voltage frequency generated by the alternating voltage generator when said direct voltage is fixed, so that the apparent value of said capacitance (12) is negative.

In an alternative embodiment, said method comprises a step consisting of selecting an alternating voltage frequency generated by the alternating voltage generator when said direct voltage is fixed, so that the apparent value of said capacitance (12) is zero.

The frequency of an alternating voltage is generated by the alternating voltage generator which is arranged in series with the direct voltage generator when the capacitance corresponds to a capacitor. For a capacitance corresponding to a circuit with an equivalent capacitance, said alternating voltage frequency corresponds to the alternating voltage generator which supplies said circuit.

Figure 2:
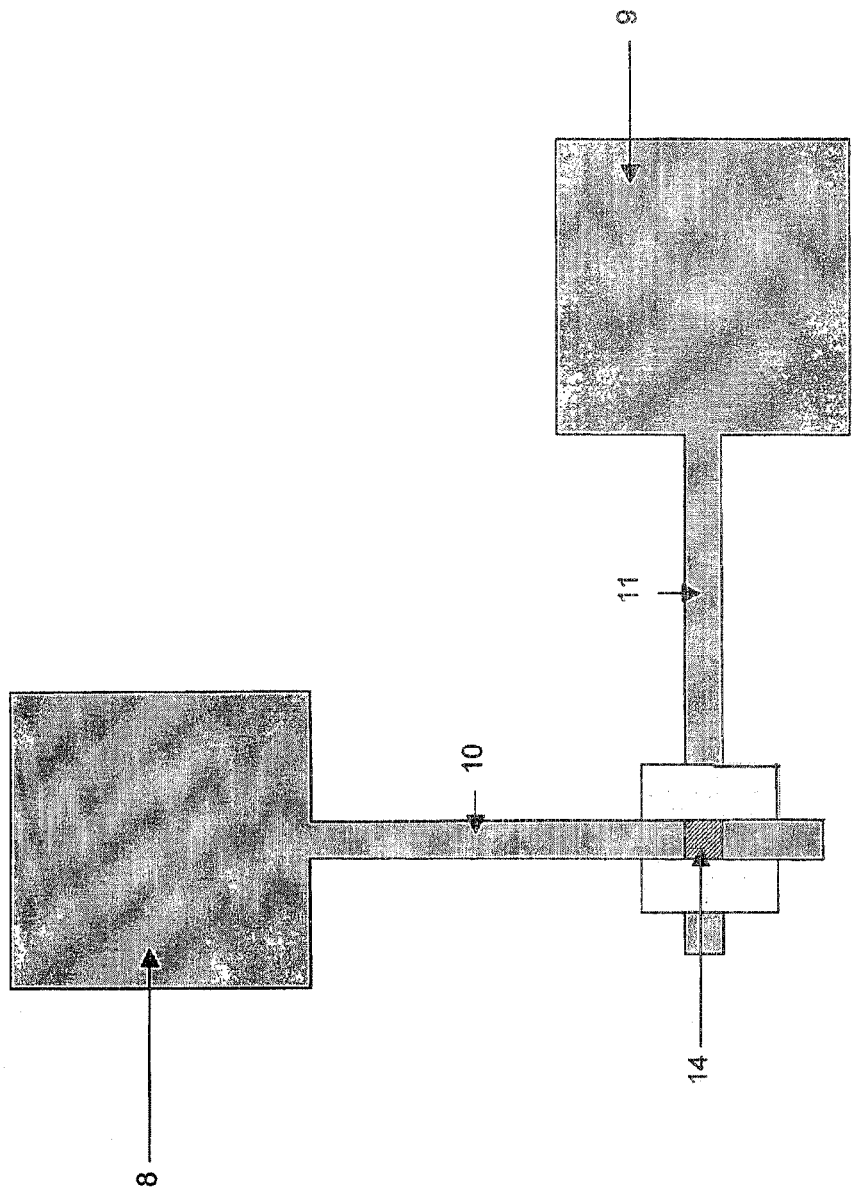
Figure 3:
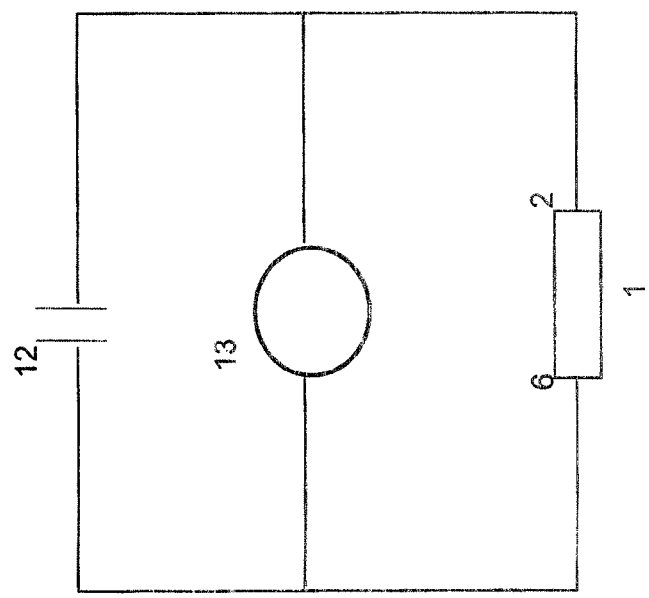
Figure 4:
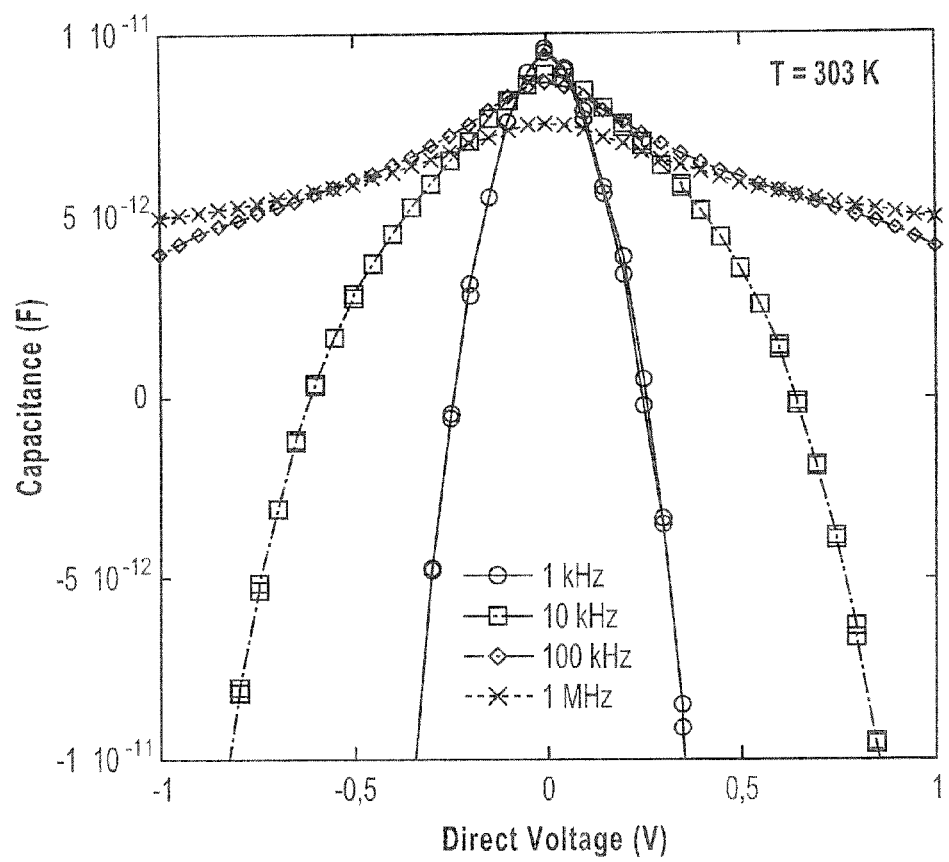
Figure 5:
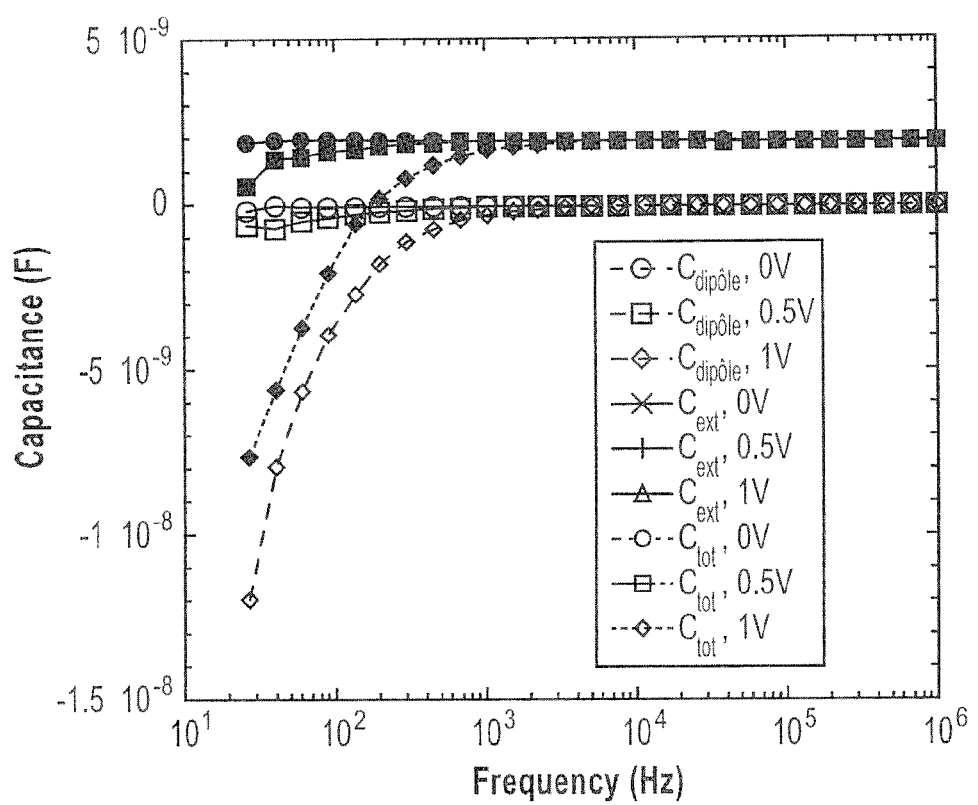
Figure 6:
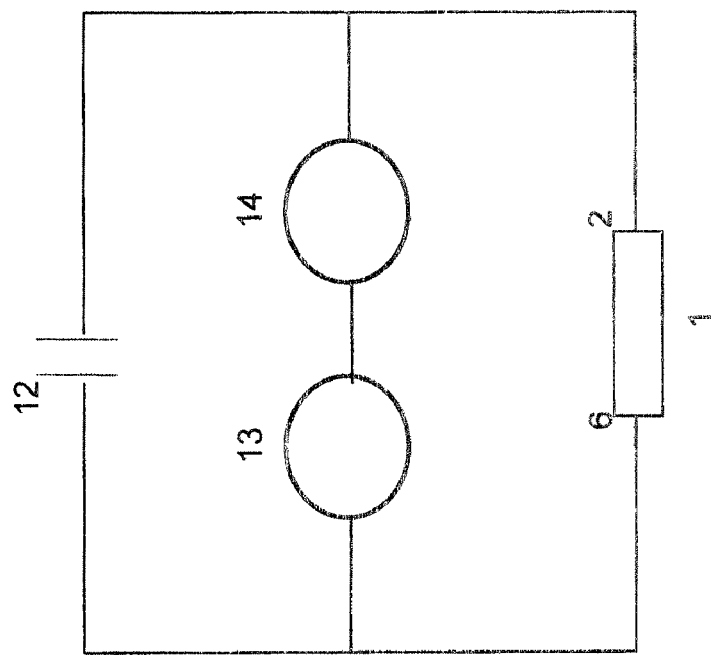
Figure 7:
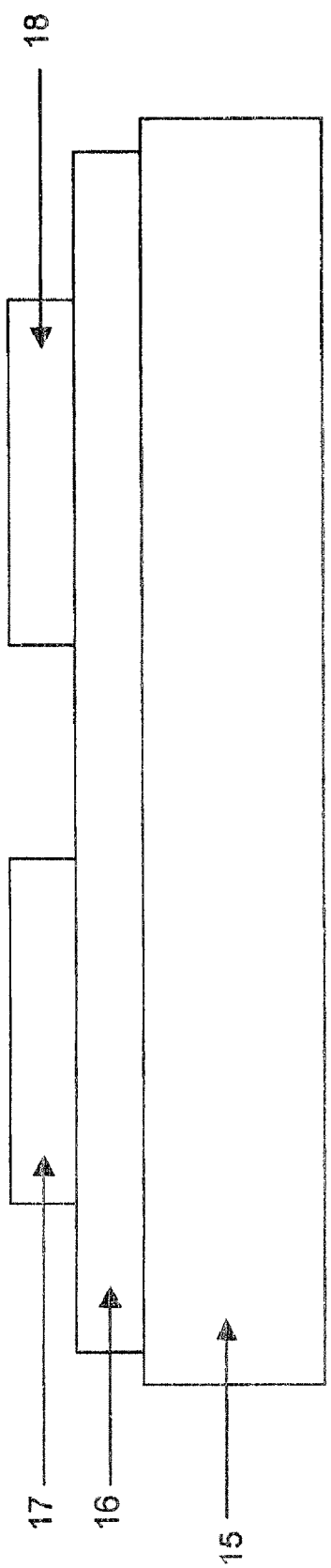

One embodiment of the invention is now described in reference to the appended figures, wherein:

FIG. 1 illustrates a cross-sectional view of the dipole;
FIG. 2 illustrates a top view of the dipole;
FIG. 3 illustrates an embodiment of the invention;
FIG. 4 corresponds to a graph of the capacitance values of the dipole according to the value of the direct voltage applied;
FIG. 5 corresponds to a graph of the capacitance values of the device according to the frequency for various direct voltage values;
FIG. 6 is an embodiment of the invention,
FIG. 7 illustrates a cross-sectional view of a dipole with a co-planar structure.

In one embodiment, the invention relates to a device which is integrated into a circuit. Said circuit comprises, in particular, a capacitor $C_{ext}$ 12 which introduces response times into said circuit. By reducing the capacitance of the capacitor $C_{ext}$ 12, the response time of the circuit is reduced and therefore improved. Using the device implemented by the invention it is possible to reduce the apparent value of the capacitor $C_{ext}$ 12 in order to improve the response times.

For this, the device comprises a dipole 1, and a direct voltage generator 13, which are mounted in parallel with the capacitor $C_{ext}$ 12. The voltage generator is connected to a computer which makes it possible to vary said voltage.

In another embodiment, $C_{ext}$ 12 is any electronic circuit or dipole having an equivalent capacitance.

The dipole, in the structure thereof, consists of a plurality of successive layers produced by various depositions.

A first aluminium deposition 6 with a thickness of 150 nm is present on the glass substrate 7 for a lower metallic electrode, a first electrode 6. On said first layer a very thin deposition of 15 nm of a titanium-tungsten alloy 5 acts as a barrier against the possible diffusion of atoms to and from the semiconductor layer. An electronic hopping transport semiconductor material 4 is deposited on said second layer. Said electronic hopping transport semiconductor material 4 corresponds, for example, to a hydrogenated amorphous carbon nitride alloy or even any other disordered material with localised electronic states. The amorphous carbon nitride is produced by ECR-PECVD (Electron Cyclotron Resonance Plasma Enhanced Chemical Vapour Deposition). Said deposition is carried out at a temperature of 300 K from the decomposition of an acetylene and nitrogen mixture. Said layer has a thickness of 50 nm, determined by an analysis technique that is suitable for measuring the thickness of thin layers such as ellipsometry.

In an alternative embodiment, an electronic hopping transport semiconductor material can be used such as an amorphous carbon nitride with different thicknesses and compositions. Said two parameters, thickness and composition, influence the values of the direct voltage and of the frequency of the alternating voltage generator 14.

A titanium-tungsten alloy deposition 3 similar to the second layer with a thickness of 15 nm is deposited on said third layer. In the same way, an aluminium deposition is made on said fourth layer for an upper electrode, the second electrode 2. Said fifth and last layer, with a thickness of 150 nm, is symmetrical to the first layer.

It is possible to vary the thicknesses of the metallic layers as well as to replace the titanium-tungsten alloy and the aluminium with other metals, while preserving the properties of the device.

The structure thus obtained is perfectly symmetrical. Said symmetry enables said dipole to function for positive voltages as well as for negative ones. In addition, it can be noted that for such a structure, the conductivity values obtained by direct voltage measurements according to a direct voltage applied between the first electrode 2 and the second electrode 6 are identical to the values deduced from continuous measurements carried out on co-planar structures obtained by depositing hydrogenated amorphous carbon nitride 16, with the chemical formula a-CN:H, on a glass substrate 15, and equipped with two co-planar aluminium electrodes 17, 18.

The first electrode 2 and the second electrode 6 respectively consist of two perpendicular lines 10, 11 equipped with square contact surfaces 8, 9 at one of the ends thereof, in order to facilitate contact with an integrated circuit or a voltage generator. The intersection of the two perpendicular lines 10, 11 defines an active surface 14 of the dipole 1.

For line widths between 5 and 200 microns, the active surface 14 of the dipole 1 is between 25 and 40,000 $\mu m^2$. The current passing through the device is proportional to the active surface thereof. This makes it possible to miniaturise said dipole 1.

In the circuit, two copper wires respectively connect the contact surface of the first electrode 8 and the second electrode 9 to BNC (Bayonet Neill-Concelman connector) connector sockets. Said copper wires are glued to said contact surfaces. The adhesive used is silver lacquer for the conductivity properties thereof. The copper wires connecting the dipole to the BNC connector sockets are deliberately short in order to minimise parasitic impedances. The BNC (Bayonet Neill-Concelman connector) cables are fixed to said connector sockets. These are coaxial cables which have an RF (Radiofrequency) connector style at the termination thereof. The shielding of said cables enables reliable signal transmission. The circuit capacitor $C_{ext}$ is connected to said same connecting sockets.

The other end of the BNC cables is connected to a measuring instrument, which is a precision impedance analyzer, for example AGILENT brand, model 4284A. Said device equipped with the option 01 has a direct voltage generator 13 that enables a continuous polarisation to be applied and an alternating voltage generator 14 mounted in series for varying the frequency.

Said device also enables a continuous polarisation to be applied at the level of the dipole and to measure the capacitance of the capacitor $C_{ext}$ 12, and the equivalent capacitance of the dipole $C_{dipole}$. It also enables the total capacitance of the system to be determined by parallel association $C_{tot}$. Same corresponds to the sum of the equivalent capacitance of the dipole and that of the circuit capacitor, i.e.:

$$C_{tot}=C_{dipole}+C_{ext}$$

The measured admittance is described in general terms by a parallel association of a conductance G and a capacitance C. The measuring instrument is connected to a computer. Said computer controls said instrument in order to perform systematic measurements according to the continuous polarisation and the frequency of the alternating voltage generated by the voltage generator 14.

Firstly, the capacitance of the capacitor $C_{ext}$ is measured for three voltage values 0 V, 0.5 V and 1 V. For this, the capacitor $C_{ext}$ is connected directly to the measuring instrument. The capacitance measured for said three values is 1.9 nF. Said capacitance is independent of the direct voltage and the frequency as can be seen in FIG. 5, which is a graph of the values for the various capacitances relating to the capacitors $C_{dipole}$, $C_{ext}$, $C_{tot}$, for the frequencies and voltages defined by the computer.

The equivalent capacitance of the dipole $C_{dipole}$ is measured in the same way. Based on FIGS. 4 and 5, it can be observed that for a zero direct voltage, $C_{dipole}$ is very weak and positive, approximately several pF. For direct voltage values of 0.5 V and 1 V, $C_{dipole}$ becomes negative at low frequencies. For a direct voltage of 1 V, capacitances with absolute values greater than 10 nF are obtained for frequencies lower than 30 Hz. Said values are much greater than those obtained with an absolute value of 0 V. FIG. 4 illustrates the various values taken by $C_{dipole}$ well for direct voltages and frequencies defined by the computer which controls the measuring instrument. The capacitance of the dipole $C_{dipole}$ changes sign for a direct voltage value that is lower the lower the frequency. When the intensity of the electrical field is increased above the value causing the sign change of the capacitance, the variation becomes more pronounced; thus, negative capacitance values which are clearly greater than the positive value measured with zero direct voltage can be obtained.

It should be noted that the value of a given frequency can be adjusted by applying an ad hoc voltage; the effective voltage range is easily accessible and is approximately one volt.

By measuring the system in parallel $C_{tot}$, the effect of the device on the capacitance $C_{ext}$ can be appreciated. The sum of the capacitances measured by $C_{dipole}$ with $C_{ext}$ is equal to the measured capacitance $C_{tot}$, irrespective of the direct voltage applied.

By varying the voltage to 0 V and 0.5 V from the computer, $C_{tot}$ takes positive values for both high and low frequencies. For a direct voltage set at 1 V, with a high alternating voltage frequency generated by the voltage generator 14, the capacitance of the dipole $C_{dipole}$ is positive and very weak in relation to that of the capacitor of the circuit $C_{ext}$, and a positive total capacitance which is practically equivalent to $C_{ext}$ is indeed measured. At low frequencies, $C_{dipole}$ takes significant negative values, the system shows an offset and $C_{tot}$ itself becomes negative when $|C_{dipole}|>C_{ext}$.

Therefore, beyond a certain voltage and at low frequencies, there is a significant capacitance offset, and the circuit can then have reduced response times. For sufficiently large voltages, the apparent capacitance of the system can, itself, become negative. Thus, for an applied voltage of 1 V, the value $C_{tot}$ is approximately $-3.2.10^{-8}$ F, much lower than the nominal value of the capacitor $C_{ext}$ in the outer circuit.

As the electrical properties of the dipole only depend on the absolute value of the voltage and not on the sign thereof, the same behaviour is obtained for negative voltages, and therefore, for example, the same value of $C_{tot}$ is obtained at −1 V and at +1 V.

To conclude, it would seem that the significant variations in the voltage of the capacitance of the dipole $C_{dipole}$ contribute to considerable variations of the capacitance of the system $C_{tot}$. This can optionally be increased, but also decreased, or even made zero or negative.

By varying the direct voltage applied between the first electrode 2 and the second electrode 6, the capacitance $C_{dipole}$ of the dipole can be controlled and enables the capacitor $C_{ext}$ to be offset in order to obtain the desired $C_{tot}$ value. The variation of said voltage is, in said embodiment, controlled by the computer.

Moreover, the variation of the capacitance of the device is directly linked to the variation of the intensity of the electrical field passing through said device. By varying said intensity, the value of the capacitance is varied. Various parameters such as, for example:

the variation of the voltage of the device,
the variation of the thickness of the layer of the electronic hopping transport semiconductor material,
the composition of said semiconductor material, enable the intensity of the electrical field to be varied and consequently the value of the capacitance in a complete range of desired frequencies.

In addition, the device as described only requires, non-exclusively, a single direct voltage source and the values of said voltage can be very weak.

It is understood that the invention can be inserted into a device compatible with silicon technologies and can be integrated above the surface of a fairly thin medium made from semiconductor material such as a silicon wafer. Indeed, the dipole 1 can be produced by depositions, as mentioned previously, at temperatures that are low enough not to interfere with the devices and integrated circuits already on the silicon wafer.

The invention claimed is:

1. A device for varying an apparent value of a capacitance, said device being characterised in that it comprises:
    a dipole (1) of a known type, comprising an electronic hopping transport semiconductor material (4) placed between a first electrode (2) and a second electrode (6), said dipole (1) being arranged in parallel with said capacitance (12);
    a direct voltage generator (13) connected electrically to the second electrode (6) and to the first electrode (2) of said dipole (1); and means for varying the voltage generated by the generator (13).

2. The device of claim 1, comprising an alternating voltage generator (14) arranged in series with said direct voltage generator (13).

3. The device of claim 1, wherein the first electrode (2) comprises a metallic line of the first electrode (10) and a contact surface of the first electrode (8), and the second electrode (6) comprises a metallic line of the second electrode (11) and a contact surface of the second electrode (9), said semiconductor material (4) being placed between said metallic line of the first electrode (10) and said metallic line of the second electrode (11), said generator (13) being connected electrically to the first electrode (2) and to the second electrode (6) respectively at the level of the contact surface of the first electrode (8) and at the contact surface of the second electrode (9).

4. The device of claim 1, made up of a glass substrate (15):
   a layer of a hydrogenated amorphous carbon nitride alloy (16) constituting the semiconductor (16),
   and a layer of aluminium for each of the co-planar electrodes (17, 18).

5. The device of claim 1, wherein the dipole (1) is made up of a glass substrate (7) and a succession of the following layers:
   a layer of aluminium (6) constituting the first electrode (2),
   a layer of titanium-tungsten alloy (5),
   a layer of a hydrogenated amorphous carbon nitride alloy (4) constituting the semiconductor (4), a layer of a titanium-tungsten alloy (3),
   and a layer of aluminium (2) constituting the second electrode (6).

6. A method for varying an apparent value of a capacitance, said method comprising steps involving:
   placing the following in parallel:
      said capacitance (12)
      a dipole (1) of a known type, comprising an electronic hopping transport semiconductor material (4) placed between a first electrode (2) and a second electrode (6),
      and a direct voltage generator (13) connected electrically to the first electrode (2) and to the second electrode (6),
   applying a direct voltage to the terminals of said first electrode (2) and of said second electrode (6), and
   varying said voltage generated by the generator.

7. The method of claim 6, comprising a step consisting of varying said voltage up to a value, said value being chosen so that the apparent value of said capacitance (12) is negative.

8. The method of claim 6, comprising a step consisting of varying said voltage up to a value, said value being chosen so that the apparent value of said capacitance (12) is zero.

9. The method of claim 6, comprising an additional step, wherein an alternating voltage generator (14) is placed in series with said direct voltage generator.

10. The method of claim 9, comprising a step consisting of selecting an alternating voltage frequency generated by the alternating voltage generator (14) when said direct voltage is fixed, so that the apparent value of said capacitance (12) is negative.

11. The method of claim 9, comprising a step consisting of selecting an alternating voltage frequency generated by the alternating voltage generator (14) when said direct voltage is fixed, so that the apparent value of said capacitance (12) is zero.

* * * * *